(12) United States Patent
Brice

(10) Patent No.: US 8,692,614 B2
(45) Date of Patent: Apr. 8, 2014

(54) TIMING ALIGNMENT FOR POWER AMPLIFIER

(75) Inventor: James Brice, Cambridge (GB)

(73) Assignee: Nujira Limited (GB)

( * ) Notice: Subject to any disclaimer, the term of this patent is extended or adjusted under 35 U.S.C. 154(b) by 67 days.

(21) Appl. No.: 13/422,218

(22) Filed: Mar. 16, 2012

(65) Prior Publication Data

US 2012/0235741 A1 Sep. 20, 2012

(30) Foreign Application Priority Data

Mar. 17, 2011 (GB) .................................. 1104568.9

(51) Int. Cl.
*H03F 1/26* (2006.01)

(52) U.S. Cl.
USPC .......................................................... 330/149

(58) Field of Classification Search
USPC ................................ 330/136, 149; 455/114.3
See application file for complete search history.

(56) References Cited

U.S. PATENT DOCUMENTS

| 6,054,896 A | 4/2000 | Wright et al. |
| 7,348,844 B2 * | 3/2008 | Jaenecke ........................ 330/149 |
| 7,746,167 B1 * | 6/2010 | Summerfield ................. 330/149 |

OTHER PUBLICATIONS

Sylvan, K., "GB Application No. 1104568.9 Search Report Jul. 13, 2011", , Publisher: UK IPO, Published in: GB.

* cited by examiner

*Primary Examiner* — Khanh V Nguyen
(74) *Attorney, Agent, or Firm* — Kaplan Breyer Schwarz & Ottesen, LLP

(57) ABSTRACT

There is described a method of controlling signal alignment in a power amplifier, comprising: receiving an input signal to be amplified; receiving a supply voltage for the power amplifier, the supply voltage being derived in dependence on the signal to be amplified; amplifying the input signal to produce an output signal; comparing the output signal with a plurality of distorted versions of the input signal, each distorted version of the input signal being associated with a different time delay value; and adjusting the timing of either the input signal or the supply voltage by an amount in dependence on a time delay value determined to be associated with a distorted version of the input signal which most closely matches the output signal.

20 Claims, 2 Drawing Sheets

TIMING ALIGNMENT FOR POWER AMPLIFIER

CROSS-REFERENCE TO RELATED APPLICATIONS

Patent application GB 1104568.9, filed Mar. 17, 2011, is incorporated herein by reference.

FIELD OF THE INVENTION

The present invention relates to the control of the alignment between an input signal to be amplified and a supply voltage for an amplifier. The invention is particularly but not exclusively concerned with an arrangement in which the supply voltage is provided by means of an envelope tracking voltage supply, which tracks the input signal to be amplified. The invention is further particularly but not exclusively related to the amplification of a radio frequency (RF) signal.

DESCRIPTION OF THE RELATED ART

Amplifiers which are provided with efficient means for providing a supply voltage are well-known. A particular known example of an efficient amplifier arrangement is the provision of an envelope tracking power supply, which tracks the input signal to be amplified to deliver a supply voltage to the amplifier which is sufficient to amplify the input signal, and reduces wasted energy which would otherwise occur if a constant supply voltage to deal with the peak voltages was provided.

In such arrangements, where the supply voltage is derived in dependence upon the signal to be amplified, inefficiencies can arise due to misalignment between the input signal to be amplified and the supply voltage delivered to the amplifier. This misalignment can be the result of, for example, the processing circuitry for providing the supply voltage tracking. This misalignment results in the supply voltage delivered to the amplifier not being precisely aligned with the input signal to be amplified from which it is derived. As a result of this misalignment, maximum efficiencies are not obtained.

It is therefore an object of the invention to provide a technique for improving the alignment between the supply voltage and the input signal to be amplified.

SUMMARY OF THE INVENTION

In one aspect the invention provides a method of controlling signal alignment in a power amplifier, comprising receiving an input signal to be amplified; receiving a supply voltage for the power amplifier, the supply voltage being derived in dependence on the signal to be amplified; and amplifying the input signal to produce an output signal, comparing the output signal with a plurality of distorted versions of the input signal, each distorted version of the input signal being associated with a different time delay value; and adjusting the timing of either the input signal or the supply voltage by an amount in dependence on a time delay value determined to be associated with a distorted version of the input signal which most closely matches the output signal.

Preferably the timing is adjusted by the one of the different time delay values associated with the determined distorted version of the input signal which most closely matches the output signal.

The distorted versions of the input signal may be estimates of an expected distortion of the input signal for a given time delay. The distortion may be an amplitude distortion and/or a phase distortion.

The method may further comprise capturing a sample of the output signal for the comparing step. The method may further comprise capturing a sample of the input signal for the comparing step. The samples of the input signal and the output signal may be synchronized.

The method may further comprise generating the plurality of distorted versions of the input signal from the captured sample of the input signal.

Each time delay value may comprise a size and a direction of a delay.

The step of adjusting the timing may include scaling the time delay value.

The method may further comprise the step of pre-distorting an RF input signal to generate the input signal to be amplified.

The method may further comprise generating the supply voltage in dependence on the input signal by tracking the input signal.

The implementation of the preferred embodiment of the invention can be summarised as follows:

Various distorted versions of a captured input signal are created. Each of these is an estimate as to what distortion would occur for a particular time delay value. Thus each distorted version is associated with a particular time delay value.

The various distorted versions of the input signal are then compared with a captured output signal, and a function applied to give a metric as to how much difference there is between the respective distorted versions and the captured output signal. The metric may also have a sign to indicate a lead/lag.

Preferably, the metric having the smallest magnitude is then determined.

Preferably, the time delay value associated with this metric is then used as the time delay value to be applied to either the supply voltage or the input to the amplifier.

Thus the time delay value to be applied is preferably not obtained as the result of a measurement: it is the time delay value originally allocated to the generated distorted version of the input which has resulted in the smallest metric. As such preferably no actual measurement is made to determine the actual delay between a distorted version of the input and the output. The metrics determined in the comparison step in the preferred embodiment give an indication of the relative delay between the signals being compared only because each distorted input is associated with a time delay. The comparison is not a time comparison: it is a match comparison that does not actually provide a time delay measurement. The comparison is not a time comparison, but a comparison to find the best match to the output signal: for example the best shape match. The difference between the distorted inputs and the captured outputs is not used other than to give a metric for comparison with the other metrics. A benefit of the preferred embodiment is that no actual timing measurement is carried out at all in this process.

In another aspect the invention provides an apparatus for controlling the alignment of signals in a power amplifier adapted to receive an input signal to be amplified and a supply voltage, the supply voltage being derived in dependence on the signal to be amplified, and to amplify the input signal to produce an output signal, the apparatus comprising a comparator for comparing the output signal with a plurality of distorted versions of the input signal, each distorted version of the input signal being associated with a time delay value; and a timing block for adjusting the timing of either the input signal or the supply voltage by an amount in dependence on a time delay determined to be associated with a distorted version of the input signal which most closely matches the output signal.

The apparatus may be further adapted for adjusting the timing by the one of the different time delay values associated with the determined distorted version of the input signal which most closely matches the output signal.

The apparatus may further include a distortion controller for generating distorted versions of the input signal, the distorted versions of the input signal being estimates of an expected distortion of the input signal for a given time delay.

The distortion controller may be adapted to generate a skew distortion or a phase distortion.

The apparatus may further include a capture block for capturing a sample of the output signal for the comparing step. The apparatus may further comprise a capture block for capturing a sample of the input signal for the comparing step. The apparatus may further comprise a controller for synchronizing the capture of the samples of the input signal and the output signal.

The distortion controller may be adapted to generate the plurality of distorted versions of the input signal from the captured sample of the input signal.

Each time delay value may comprise a size and a direction of a delay.

The apparatus may further comprise a scaling block for scaling the time delay value.

The apparatus may further comprise a pre-distortion block for pre-distorting an RF signal to generate the input signal

BRIEF DESCRIPTION OF THE FIGURES

The invention will now be described with reference to the accompanying drawings, in which.

DESCRIPTION OF THE PREFERRED EMBODIMENTS

The present invention is now described by way of example with reference to exemplary embodiments. One skilled in the art will appreciate that embodiments are described for ease of understanding the invention, and the invention is not necessarily limited to details of any embodiment described. The scope of the invention is defined by the appended claims.

Figure 1:
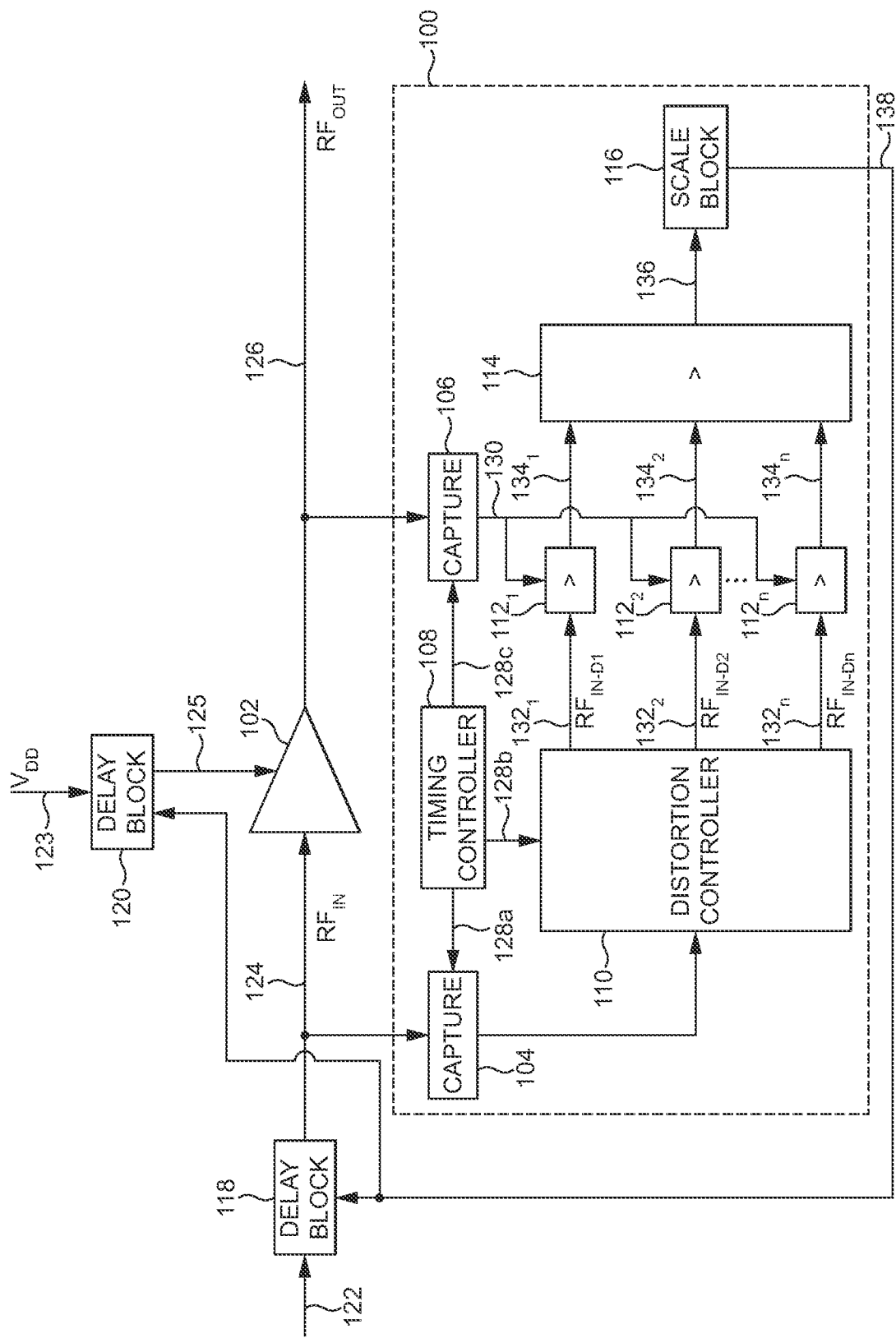
FIG. 1 illustrates schematically the functional blocks required in an exemplary implementation of the invention.

With reference to FIG. 1 there is illustrated schematically the functional blocks required for an exemplary implementation of the invention. The invention is described in the context of an advantageous implementation associated with an RF amplifier. FIG. 1 illustrates an RF amplifier 102. The amplifier 102 receives an RF input signal to be amplified, $RF_{IN}$, on a line 124. The RF amplifier 102 generates an output RF amplified signal, $RF_{OUT}$, on line 126. The RF amplifier 102 additionally receives a supply voltage (or voltages) on a supply voltage line 125.

In accordance with embodiments of the invention, the inputs to the RF amplifier 102 are modified to be provided by delay blocks. In FIG. 1 there is illustrated a delay block 118, which receives the RF input signal on a line 122, and provides a delayed version thereof as the RF input signal to be amplified $RF_{IN}$ on line 124. The delay block 120 receives the supply voltage $V_{DD}$ on line 123, and generates a delayed version thereof on line 125 as the supply voltage for the RF amplifier 102. In embodiments, only one of the delay blocks 120 or 118 may be provided, as will be discussed further hereinbelow.

Associated with the RF amplifier 102, as illustrated in FIG. 1, is apparatus 100 for controlling the alignment of the input signal to be amplified on line 124 and the supply voltage on line 125 in accordance with an embodiment of the invention. As will be discussed further in detail hereinbelow, the apparatus 100 is arranged to control the delay applied in either or both of the delay blocks 118 and 120 to reduce the misalignment between the input signal to be delivered to the amplifier on line 124 and the supply voltage delivered to the amplifier on line 125.

The apparatus 100 includes an input capture block 104; an output capture block 106; a timing controller 108; a distortion controller 110; a plurality, n, of comparators $112_1$ to $112_n$; a comparator 114; and a scale block 116.

The timing controller 108 generates control signals for the apparatus 100. As illustrated in FIG. 1, the timing controller 108 generates control signals $128a$, $128b$, $128c$ to the input capture block 104, the distortion controller 110, and the output capture block 106 respectively. The input capture block 104 receives as an input the input signal to be amplified on line 124. The distortion controller receives as an input the output of the input capture block 104 on line 129. The distortion controller 110 generates a plurality of outputs on signal lines $132_1$ to $132_n$ to each of the respective plurality of comparators $112_1$ to $112_n$. The output capture block 106 receives as an input the amplified output signal on line 126. Preferably each capture block 106 receives a scaled version of the amplified output signal. The comparators $112_1$ to $112_n$ each additionally receive a second input from the output of the output capture block 106 on line 130. The comparators $112_1$ to $112_n$ each generate an output on signal lines $134_1$ to $134_n$ which form a plurality of inputs to the comparator 114. The comparator 114 generates an output on signal line 136 which forms an input to the scale block 116. The scale block 116 generates an output on line 138 which is provided as an input to either or both of the delay block 118 and the delay block 120.

Figure 2:
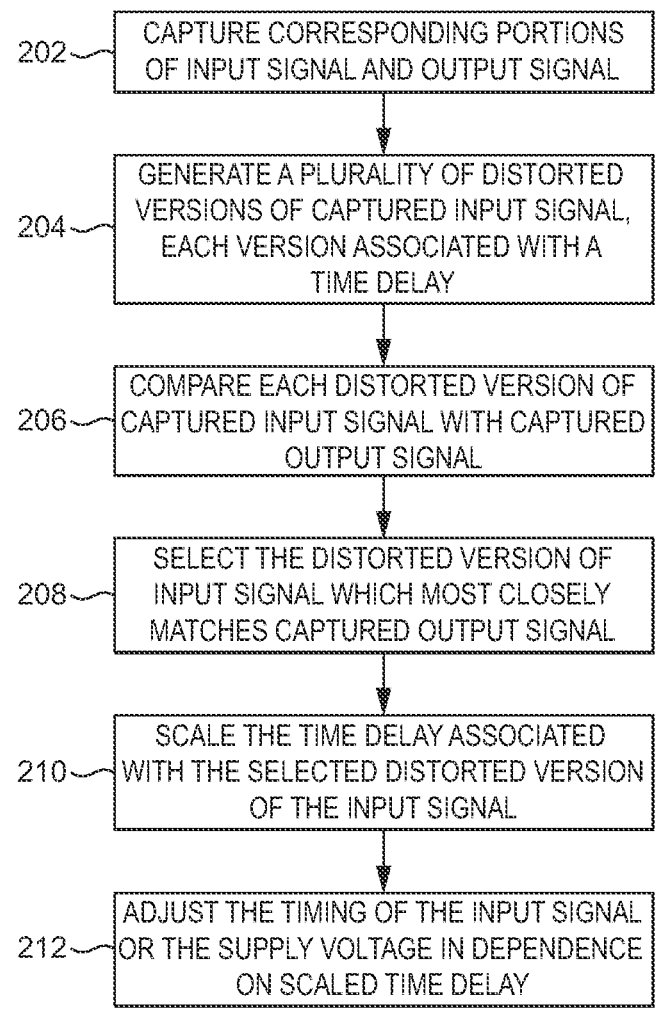
FIG. 2 illustrates the process steps in an exemplary implementation of the present invention consistent with the arrangement of FIG. 1.

The operation of the apparatus 100 of FIG. 1 will now further be described with further reference to FIG. 1, and with reference to the flow process of FIG. 2.

In a step 202, the input capture block 104 and output capture block 106 are controlled in order to capture portions of the input signal and output signal on lines 124 and 126 respectively. This operation is performed under the control of the timing controller 108, in order to synchronise the capture operation to capture the respective portion of the input signal which the output signal is based on.

Preferably, the portion of the input signal which is captured is the input signal $RF_{IN}$ on line 124 delivered to the input of the RF amplifier 102, which includes any pre-distortion applied to the input signal in a pre-distortion stage (not shown), as known in the art. In an alternative arrangement, the input signal may be captured for processing in the apparatus 100 at a stage prior to any pre-distortion being applied.

The input signal captured in the input capture block 104 is delivered to the distortion controller 110.

As denoted by step 204, the distortion controller 110 operates to generate a plurality of distorted versions of the captured input signal, each version being associated with a time delay.

The invention, and its embodiments, depends upon there existing a correlation between the size of the misalignment between the input signal and the supply voltage (or the delay therebetween) and the distortion caused in the output signal by such misalignment. The distortion controller 110 is adapted to generate a plurality of distorted versions of the input signal, each of which corresponds to the distortion that would result from a particular delay/misalignment between the input signal and the supply signal.

The distortion may be applied in a variety of different ways as will be understood by one skilled in the art. For example there may be estimated, for example based on pre-characterisation of a device, a distortion in the output signal caused by a particular misalignment (delay) value between the input signal and the supply signal. The distortion controller 110 may then be provided with a set of predetermined distortions, which are applied to the captured input signal to generate a set of distorted versions of the input signals on the output lines 132$_1$ to 132$_n$, as signals $RF_{IN\_D1}$ to $RF_{IN\_Dn}$. Thus the distortion controller generates a plurality of distorted versions of the captured input signal, each version being associated with a particular time delay.

The distortion applied to the input signal is not limited to a particular type of distortion. The distortion may be any one or more of an amplitude distortion, or a phase distortion applied to the input signal. The amplitude distortion may be associated with a direction of the amplitude. The distortion represents the distortion resulting from a timing misalignment between the voltage supply arriving at the supply input to the amplifier and the input signal to be amplified arriving at the input to the amplifier. The distortion caused by this delay could, for example, be a delay in the higher amplitude components of the captured signal relative to the lower amplitude components of the captured signal.

The invention is not concerned with the implementation of the distortion controller 110. One skilled in the art will appreciate that in general the distortion controller provides a plurality of estimates of any distortion effect which would occur in operation in the output signal, applied to the input signal.

In a step 206, each distorted version of the captured input signal on lines 132$_1$ to 132$_n$ is then compared with the captured output signal on line 130 in the respective comparators 112$_1$ to 112$_n$. A signal representing the result of each of such comparisons is generated on respective signal lines 134$_1$ to 134$_n$ to the comparator 114.

In a step 208, the comparator 114 then selects the distorted version of the input signal on the lines 132$_1$ to 132$_n$ which most closely matches the captured output signal on line 130, in dependence on the comparison data on lines 134$_1$ to 134$_n$. In an example implementation, the comparators 112$_1$ to 112$_n$ generate the RMS difference between the distorted delay signals on the input lines 132$_1$ to 132$_n$ and the captured signal on line 130. The comparator 114 then selects the signal on lines 134$_1$ to 134$_n$ which yields the smallest difference.

As each of the distorted signals on lines 132$_1$ to 132$_n$ is associated with a particular time delay value, then the comparator 114, in dependence upon which of the signals on lines 134$_1$ to 134$_n$ is indicated as being the distorted signal which most closely matches the output signal, is able to determine the associated delay value. This delay value is delivered on an output line 136 to the scale block 116. Alternatively, the result of the comparator operation 114 may be provided to a controller which is then able to deliver the delay value to the scale block 116.

The embodiment described in the foregoing may be understood to be a successive approximation technique: all possible delay values are tested and then the most likely is selected. In such an arrangement, in an iterative technique once the initial delay is selected, the delay values and associated distortions may be updated to allow a finer adjustment around the initial selected point. Thus the initial assessment may be determined for n=5, with values [−2, −1, 0, +1, +2]. The subsequent assessment may be determined for n=5, with values [−0.2, −0.1, 0, +0.1, +0.2].

In this described embodiment there is, advantageously, no requirement to measure or calculate the actual time delay.

The invention is not limited to the technique described in the foregoing and other techniques may be utilised.

One alternative technique is to evaluate a metric for each of the n delay values, and then to generate a curve representing a fit of metric against time offset (delay). The minimum point of such curve (or zero crossing point if signed) then provides the required time offset. In such a case the delay applied is not necessarily one of those which is predefined, but may be a value in between two predefined delays. In this arrangement, a measurement of the time delay may be required.

Another alternative approach is to update an offset (delay value) using some predefined scaling factor and estimated offset error, such as new_offset=current_offset−(scaling_factor)·(estimated_offset_error). This is a gradient-based adaptive (iterative) solution. Eventually the estimated offset is zero, so new_offset becomes equal to current_offset and the algorithm converges. In this arrangement, the actual time delays are required to be measured.

In a step 210 the scale block 116 scales the time delay value associated with the selected distorted version of the input signal. The comparators 112$_1$ to 112$_n$ preferably provide information which identifies not only the size of the distortion, but also the direction of the distortion. Thus the delay value provided to the scale block 116, and scaled by the scale block 116, also includes information as to the direction of the delay, i.e. whether the input signal to be amplified leads or lags the supply voltage.

The scale block 116 applies scaling to compensate for any scaling necessary to relate the delay in the sampled signals processed in the apparatus 100 to the signals delivered to the inputs of the amplifier.

In an alternative, the scaling block 116 may be replaced by a control block which simply provides an indication at its output of the direction of the timing misalignment, rather than additionally an estimate of the size of the misalignment. The scale block 116 may therefore provide information to apply a delay of a certain size in a certain direction, or may provide information to step the timing of a signal by a predetermined amount in a direction in accordance with the direction of the misalignment.

The output of the scale block 116 is provided on line 138 to one or both of the delay blocks 118 and 120. In a preferred arrangement, only one of the delay blocks 118 and 120 is provided, in accordance with implementation preferences, such that the timing alignment compensation is applied to either the input signal to be amplified or to the supply voltage. However in alternative arrangements both delay blocks 118 and 120 may be provided, and for example the delay may be applied in the appropriate block according to which of the two inputs leads, such that the leading input is delayed.

As denoted by step 212, the timing of the input signal or the supply voltage is then adjusted in dependence on the scaled time delay, or in an alternative implementation is adjusted by a predetermined amount in a direction indicated by the scale block 116.

Thus, in accordance with the principles of the invention and its embodiments, misalignment between the input signal to the amplifier and the supply voltage to the amplifier can be advantageously compensated for preferably without actually measuring the absolute timing of the two signals. Only the relative delay of on signal compared to the other needs to be determined. In one arrangement, it is sufficient to simply know which signal leads, so a compensatory delay can be applied to the signal which leads. In another arrangement, the actual delay is determined so that the delay value can applied (with optional scaling) to one of the two signals. Thus a simplified mechanism is provided for compensating for misalignment, which does not require any complicated measurement. Misalignment is reduced where misalignment exists.

The invention, and its embodiments, relies upon generating an estimate of what the input signal would have looked like if it had been delayed by a certain amount. The invention and its embodiments recognise that as a result of any delay between the input signal and the supply, the output signal would be distorted. A plurality of estimates of that distortion are made, corresponding to a plurality of delay values.

The invention, and its embodiments, is dependent upon the supply voltage input being derived in dependence on the input signal to be amplified. Preferably the supply voltage tracks the input signal to be amplified. Preferably an envelope tracking supply generates the supply signal from an input signal representing the envelope of the input signal to be amplified.

The invention has been described herein by way of reference to particular examples and embodiments, for the purposes of illustrating the invention and its embodiments. The invention is not limited to the specifics of any embodiment described herein. Any feature of any embodiment may be implemented in combination with features of other embodiments, no embodiment being exclusive. The scope of the invention is defined by the appended claims.

What is claimed is:

1. A method of controlling signal alignment in a power amplifier, comprising:
   receiving an input signal to be amplified;
   receiving a supply voltage for the power amplifier, the supply voltage being derived in dependence on the signal to be amplified;
   amplifying the input signal to produce an output signal;
   comparing the output signal with a plurality of distorted versions of the input signal, each distorted version of the input signal being associated with a different time delay value; and
   adjusting the timing of either the input signal or the supply voltage by an amount in dependence on a time delay value determined to be associated with a distorted version of the input signal which most closely matches the output signal.

2. The method of claim 1 wherein the timing is adjusted by the one of the different time delay values associated with the determined distorted version of the input signal which most closely matches the output signal.

3. The method of claim 1 wherein the distorted versions of the input signal are estimates of an expected distortion of the input signal for a given time delay.

4. The method of claim 1 wherein the distortion is an amplitude distortion and/or a phase distortion.

5. The method of claim 1 further comprising capturing a sample of the output signal for the comparing step.

6. The method of claim 5 further comprising capturing a sample of the input signal for the comparing step.

7. The method of claim 6 wherein the samples of the input signal and the output signal are synchronized.

8. The method of claim 6 further comprising generating the plurality of distorted versions of the input signal from the captured sample of the input signal.

9. The method of claim 1 wherein each time delay value comprises a size and a direction of a delay.

10. The method of claim 1 further comprising the step of pre-distorting an RF input signal to generate the input signal to be amplified.

11. The method of claim 1 further comprising generating the supply voltage in dependence on the input signal by tracking the input signal.

12. An apparatus for controlling the alignment of signals in a power amplifier adapted to receive an input signal to be amplified and a supply voltage, the supply voltage being derived in dependence on the signal to be amplified, and to amplify the input signal to produce an output signal, the apparatus comprising:
   a comparator for comparing the output signal with a plurality of distorted versions of the input signal, each distorted version of the input signal being associated with a different time delay value; and
   a timing block for adjusting the timing of either the input signal or the supply voltage by an amount in dependence on a time delay determined to be associated with a distorted version of the input signal which most closely matches the output signal.

13. The apparatus of claim 12 wherein the timing block is further adapted for adjusting the timing by the one of the different time delay values associated with the determined distorted version of the input signal which most closely matches the output signal.

14. The apparatus of claim 12 further including a distortion controller for generating distorted versions of the input signal, the distorted versions of the input signal being estimates of an expected distortion of the input signal for a given time delay.

15. The apparatus of claim 14 wherein the distortion controller is adapted to generate an amplitude distortion and/or a phase distortion.

16. The apparatus of claim 14 further comprising a capture block for capturing a sample of the output signal; and a capture block for capturing a sample of the input signal.

17. The apparatus of claim 16 further comprising a controller for synchronizing the capture of the samples of the input signal and the output signal.

18. The apparatus of claim 16 wherein the distortion controller is adapted to generate the plurality of distorted versions of the input signal from the captured sample of the input signal.

19. The apparatus of claim 12 wherein each time delay value comprises a size and a direction of a delay.

20. The apparatus of claim 12 further comprising a pre-distortion block for pre-distorting an RF signal to generate the input signal.

* * * * *